(12) United States Patent
Jain

(10) Patent No.: US 6,853,597 B2
(45) Date of Patent: Feb. 8, 2005

(54) INTEGRATED CIRCUITS WITH PARALLEL SELF-TESTING

(75) Inventor: Raj Kumar Jain, Singapore (SG)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/065,220

(22) Filed: Sep. 26, 2002

(65) Prior Publication Data

US 2003/0063517 A1 Apr. 3, 2003

Related U.S. Application Data

(63) Continuation-in-part of application No. 10/131,364, filed on Apr. 24, 2002, now Pat. No. 6,628,541, which is a continuation-in-part of application No. 09/806,299, filed on Oct. 3, 2001, now Pat. No. 6,552,951.

(51) Int. Cl.[7] .................................................. G11C 7/00
(52) U.S. Cl. .................................... 365/201; 365/222
(58) Field of Search .......................... 365/201, 230.03, 365/222, 230.01, 200, 189.04, 220

(56) References Cited

U.S. PATENT DOCUMENTS

| | | | |
|---|---|---|---|
| 4,193,125 A | 3/1980 | Moriya | 365/104 |
| 4,639,892 A | 1/1987 | Mizugaki et al. | 365/182 |
| 5,293,386 A | 3/1994 | Muhmenthaler et al. | 371/21.1 |
| 5,394,354 A | 2/1995 | Watabe et al. | 365/51 |
| 5,414,653 A | 5/1995 | Onishi et al. | 365/145 |
| 5,535,164 A | 7/1996 | Adams et al. | 365/201 |
| 5,541,872 A | 7/1996 | Lowrey et al. | 365/145 |
| 5,617,531 A * | 4/1997 | Crouch et al. | |
| 5,764,588 A | 6/1998 | Nogami et al. | 365/230.05 |
| 5,856,940 A | 1/1999 | Rao | 365/149 |
| 5,909,404 A * | 6/1999 | Schwarz | 365/201 |
| 5,963,468 A | 10/1999 | Rao | 365/149 |
| 6,067,265 A | 5/2000 | Mukunoki et al. | 365/210 |
| 6,108,252 A * | 8/2000 | Park | 365/201 |
| 6,147,895 A | 11/2000 | Kamp | 365/145 |
| 6,297,997 B1 * | 10/2001 | Ohtani et al. | 365/201 |
| 6,310,807 B1 * | 10/2001 | Ooishi et al. | 365/200 |
| 6,421,797 B1 | 7/2002 | Kim | 714/718 |
| 6,523,135 B1 * | 2/2003 | Nakamura | 714/30 |
| 2002/0194558 A1 * | 12/2002 | Wang et al. | 714/718 |

OTHER PUBLICATIONS

Daisaburo, Takashima, Iwao Kunishima; "High–Density Chain Ferroelectric Random Access Memory (Chain FRAM)"; IEEE Journal of Solid–State Circuits, vol. 33, No. 5; May 1998; pp. 787–792.

* cited by examiner

Primary Examiner—Thong Q. Le
(74) Attorney, Agent, or Firm—Horizon IP Pte Ltd

(57) ABSTRACT

An integrated circuit having a BIST control unit for testing a plurality of memory banks simultaneously is described. The BIST control unit is coupled to a plurality of comparator units. In one embodiment, a comparator unit is coupled to a memory bank to facilitate parallel testing.

30 Claims, 4 Drawing Sheets

INTEGRATED CIRCUITS WITH PARALLEL SELF-TESTING

CROSS REFERENCE TO RELATED APPLICATIONS

This is a continuation-in-part of patent applications, titled: "Dual-Port Memory Cell", U.S. Ser. No. 09/806,299 filed Oct. 3, 2001, now U.S. Pat. No. 6,552,951 and is a continuation-in-part "Memory Architecture with Refresh and Sense Amplifiers", U.S. Ser. No. 10/131,364 filed Apr. 24, 2002, now U.S. Pat. No. 6,628,541.

BACKGROUND OF INVENTION

Integrated circuits (ICs) such as digital signal processors (DSPs) include on-chip memory for storage of information. The on-chip memory typically comprises, for example, an array of memory cells connected by word lines in one direction and bit lines in another direction. The memory cells are routinely tested to ensure that the memory is properly readable or writable. Testing may be carried out by writing test patterns into particular memory locations and reading the test patterns to verify that both the written and read-out test patterns are consistent. Those memory locations that produce inconsistent results may be repaired through the use of redundancy schemes, if available.

Built-in self-testing (BIST) circuits may be embedded into the IC to improve the speed and versatility of testing without external hardware. The BIST circuit addresses, writes the test pattern and reads one memory location at a time. However, as the size of the memory increases; especially in multi-bank memory architectures, the number of memory locations to be tested will also increase. This requires more time to test the memory. The longer test times translate into higher manufacturing costs.

As evidenced from the above discussion, it is desirable to provide an improved testing circuit that increases the efficiency of testing.

SUMMARY OF INVENTION

The invention relates generally to ICs with a plurality of memory banks. More particularly, the invention relates to built-in self-testing of memory banks. In one embodiment, a BIST control unit is provided for testing the plurality of memory banks simultaneously. The BIST control unit is coupled to a plurality of comparator units. In one embodiment, a comparator unit is coupled to a memory bank for comparing a test pattern written to the memory bank against data read from the memory bank.

DETAILED DESCRIPTION

Figure 1:
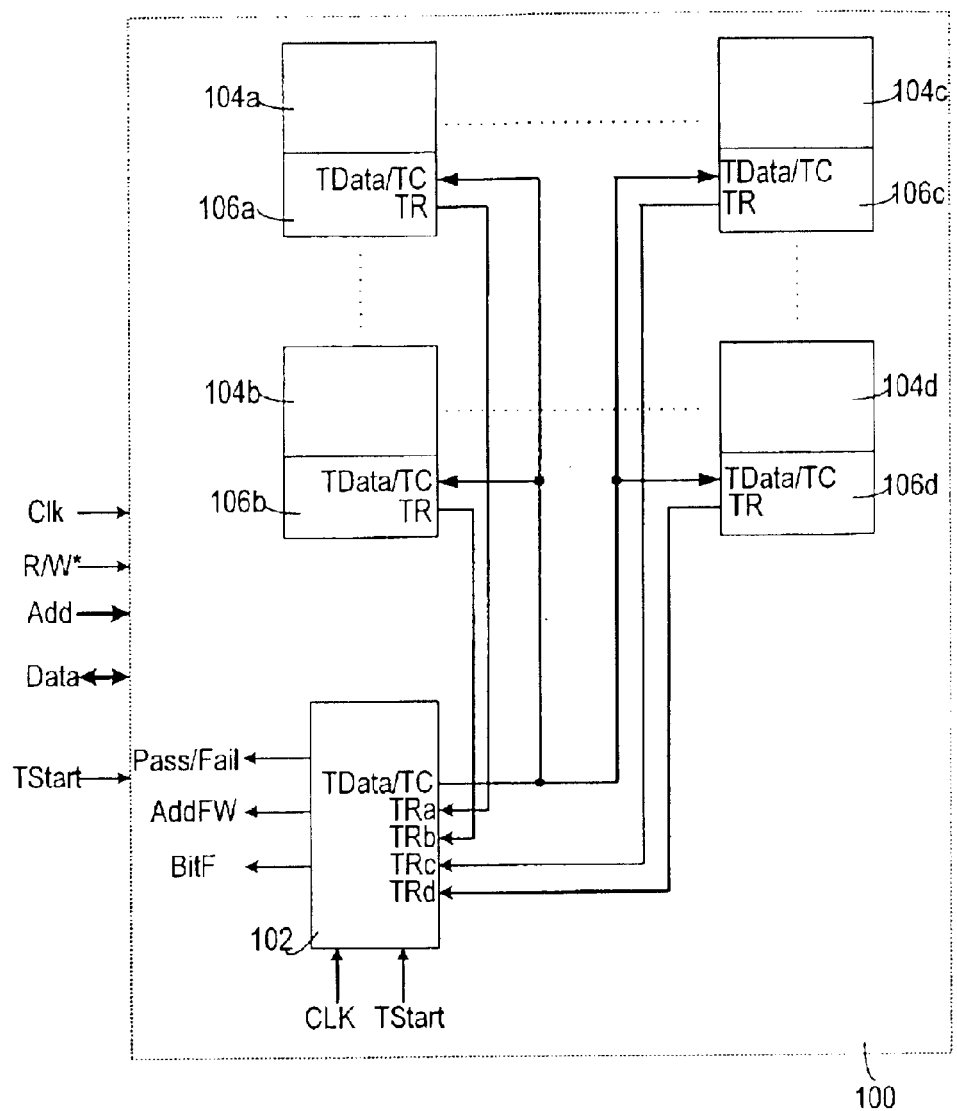
FIG. 1 shows a block diagram of a memory device in accordance with one embodiment of the invention.

FIG. 1 shows a memory module 100 in accordance with one embodiment of the invention. The memory, for example, is a part of an IC such as a DSP. Other types of ICs, such as a memory IC, are also useful. The memory module includes a BIST control unit 102. In one embodiment, a single BIST control unit 102 is provided to test a plurality of memory banks 104a–d simultaneously. Various input signals, such as the clock signal CLK and activation signal TStart, are provided to the BIST control unit. The clock signal CLK provides the timing for operations such as the transmission of data, and the activation signal TStart activates the BIST control unit during test mode.

In accordance with the invention, a comparator unit 106 is coupled to a memory bank 104 to facilitate parallel testing. The comparator unit compares the test patterns written to memory against the actual data read from memory. A failure occurs when a mismatch is found. The test patterns TData are provided to the comparator units simultaneously by the BIST control unit, and comparison is carried out in parallel to reduce the amount of time required for testing. A variety of test patterns, such as the march, checkerboard, wordline stripe or blanket patterns, may be provided. The test patterns may be hard-coded in the BIST control unit or programmed during the test mode.

In one embodiment, the BIST control unit generates the test control signals TC for performing the memory test. The test control signals comprise, for example, the addresses of memory words to be tested (Add), clock signal (CLK), bank select signal (Sel) and read/write signal (R/W*). In one embodiment, the BIST control unit initiates a write operation by activating the write signal. The banks are selected by, for example, activating the bank select signal (Sel).

In one embodiment, the BIST control unit initiates memory access to all locations in the memory banks. In one embodiment, the BIST control unit initiates a write of the test pattern by activating the write signal, providing the addresses of the memory locations to be tested and the test pattern TData to the comparator unit. A read test is performed thereafter by activating the read signal, addressing the memory locations and activating the comparator units. For illustrative purposes, the test control signals (TC) and test pattern (TData) are shown as being coupled directly to the memory banks. The test control signals, such as the test addresses, may be multiplexed with addresses for normal memory access (available during a non-testing mode) and transferred to the memory banks via a common memory address bus. Similarly, the test pattern may be placed on a common data bus that receives data during a non-testing mode.

To facilitate parallel testing of the memory banks, addressing is performed by the BIST control unit. In one embodiment, the banks occupy a common address space. For example, bank 1 occupies address space 00000 to 0FFFF and bank 2 occupies address space 10000 to 1FFFF. Hence, the common address space is 0000 to FFFF. In one embodiment, the BIST control unit selects the banks simultaneously and generates addresses in the common address space to perform access operations on all banks. Alternatively, banks with different memory sizes are also useful. For example, if bank 1 occupies the larger address space (0000 to FFFF) and bank 2 occupies the smaller address space (1010 to 10FF), the common address space (10 to FF) may be tested simultaneously. The remaining non-common memory space (100 to FFF) of bank 1 is tested separately by deactivating bank 2.

In one embodiment, write and read operations are performed for a plurality of test patterns in a plurality of test runs. The comparator unit combines the results for the plurality of test runs and generates the final test results TR to the BIST control unit. The test results TR include, for example, signals such as a repairable/non_repairable signal (Rep/NRep*), the addresses of the faulty words (AddFW) and the locations of the faulty bits (or memory cells) within a faulty word (BitF).

In one embodiment, redundancy may be provided for repairing the memory IC when faults occur. In one embodiment, a redundant memory buffer is provided locally in a memory bank. Alternatively, a redundant memory buffer may be provided globally for all the memory banks. In one embodiment, the addresses of the faulty memory cells are stored in the comparator unit and used to replace faulty memory cells with redundant cells from the redundant memory buffer. In one embodiment, if the number of faulty cells exceeds the size of the redundant memory buffer, the NRep signal is activated to indicate that the memory bank cannot be repaired and testing is stopped for that memory bank. Otherwise, the signal Rep is activated to indicate that bank can be repaired using redundancy.

Figure 2:
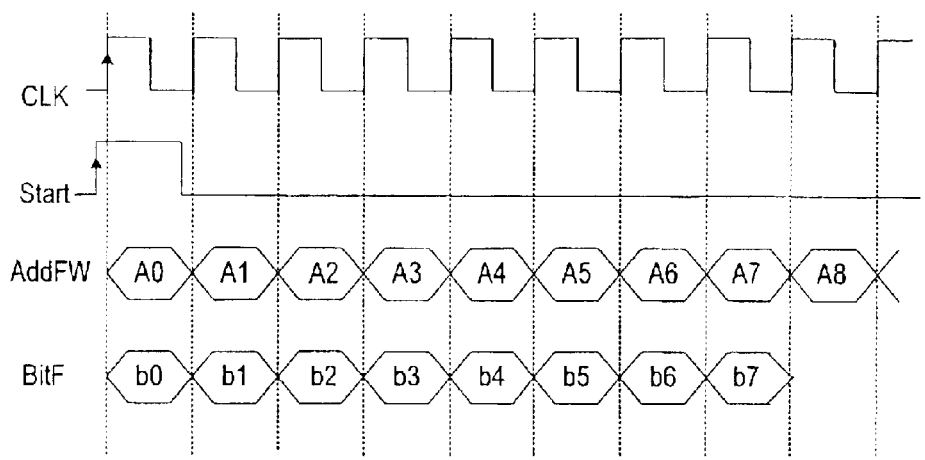
FIG. 2 shows the timing of clock signals and output test results in accordance with one embodiment of the invention.

In one embodiment, a Start signal is generated to activate the transmission of test results when testing is completed, as shown in FIG. 2. In one embodiment, the BIST control unit captures the test results from the comparator units and serially outputs the test results in response to the active signal (Start) and the input clock signal (CLK). In one embodiment, the test results comprise the addresses of the faulty words (AddFW) and the bit patterns (BitF), which indicate the locations of the faulty bits within the faulty words. In one embodiment, the address (AddFW) comprises a plurality of address bits (e.g. A0–A8). In dual-port memory architectures, wherein the memory cell comprises a first port and a second port, the address may also indicate the port corresponding to the test results. In one embodiment, the first address bit A0 is set to "0" for the first port and "1" for the second port. The size of the bit pattern BitF (e.g. b0–b7) is associated with the size of a memory word, which is illustratively set to 8. Other word sizes, such as 16, 24 or 32, are also useful. Preferably, a word size is equal to 2 bit, where n is a whole number. Providing a word size equal to 1 is also useful. For example, the bit pattern "00000011" indicates bits 0 and 1 are faulty. Other suitable addressing methods are also useful.

In one embodiment, testing is carried out in either single-port or dual-port modes. During a single-port test mode, the first port serves as an access port and the second port serves as a refresh port. Testing is carried out, for example, by writing the test data to the access port and subsequently reading the data from the access port. Testing of the refresh operation is subsequently carried out by refreshing the refresh port, and then reading the access port. During a dual-port test mode, read/write access and refresh operations may be performed at either the first port or the second port. For example, test data is written to either the first port or the second port and subsequently read from, for example, both ports. The refresh operation is then carried out by refreshing either the first port or the second port and reading the data from, for example, both ports. The test sequence is preferably designed to detect most or all cases of failure in the memory cell, hence ensuring a high accuracy in testing.

Figure 3:
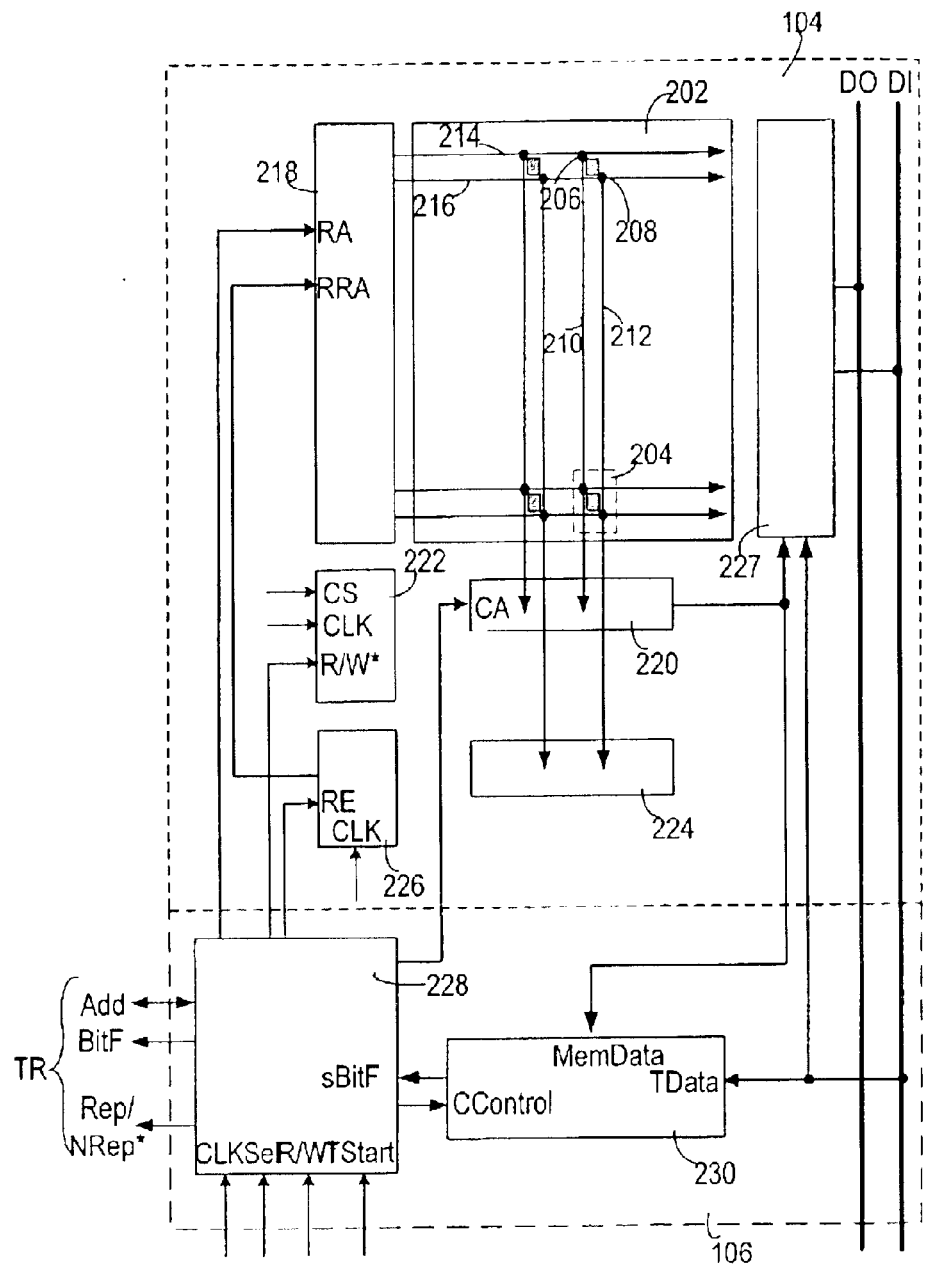
FIG. 3 shows a memory bank and comparator unit in accordance with one embodiment of the invention.

FIG. 3 shows a memory bank 104 and comparator unit 106 in accordance to one embodiment of the invention. In one embodiment, the memory bank comprises at least one memory sub-array 202. It is also useful to provide a different number of sub-arrays (e.g. 2 or 4). The memory sub-array comprises memory cells 204. In one embodiment, a memory cell comprises a first port 206 and a second port 208. Providing memory cells with one or more than two ports is also useful. In one embodiment, first bit lines 210 and second bit lines 212 interconnect the memory cells in a first direction; first word lines 214 and second word lines 216 interconnect the memory cells in a second direction.

A memory access may be performed through the first port or the second port. The first port is accessed by selecting the appropriate first word line and first bit line and the second port is being accessed by selecting the appropriate second word line and second bit line. In one embodiment, a refresh operation is performed through one of the ports. Preferably, the refresh operation is performed through only one of the ports, for example, the second port 208. Providing a memory array which can be refreshed via either of the ports is also useful.

In one embodiment, the first word lines are coupled to a first row decoder 218, wherein the first row decoder includes decoding logic and word line drivers coupled to the first word lines. The decoding logic receives a first row address (RA); decodes it, and activates the word line driver coupled to the word line corresponding to the decoded address. The word line driver drives the word line to an active voltage (e.g., active high voltage such as $V_{DD}$ for n-channel memory). In one embodiment, the second word lines are coupled to a second row decoder. The second row decoder can be, for example, a part of the first row decoder 218 as shown in FIG. 3. Providing a separate row decoder is also useful. The second row decoder includes decoding logic which selects a second word line based on a second row address (RRA). To perform a memory access, such as a read/write access, an access control circuit 222 receives the input signals (e.g., CS, CLK, R/W*) and generates internal control signals to perform the memory access. In one embodiment, the row decoder is operated in response to a row address (e.g., RA or RRA). The memory cells corresponding to the row address is accessed.

First and second sense amplifier banks (220 and 224) having a plurality of sense amplifiers are coupled to first and second bitlines to facilitate memory accesses. The first bitlines of the memory cells are coupled to the first sense amplifier bank while the second bitlines of the memory cells are coupled to the second sense amplifier bank.

A sense amplifier is coupled to two first or two second bitlines for sensing and amplifying a differential signal created by a selected memory cell. The sense amplifier bank may also include, for example, column decoders, pre-charge amplifiers and write circuitry to facilitate memory accesses. The column decoder receives a column address CA and selects an output signal of the appropriate sense amplifier, and forwards it to interface circuitry 227. The interface circuitry 227 transfers data read from the selected cell to, for example, a data-out bus (DO). If the memory access is a write, data is provided on, for example, a data-in bus (DI) and distributed through the data path back to the selected memory cell. Alternatively, a shared data bus for both data-in and data-out may be provided.

In one embodiment, a refresh control circuit 226 is provided to generate the signals to perform refreshing the memory cells. The refresh enable signal RE indicates the activation of a refresh operation. The RE signal may be used to generate control signals such as the refresh row address (RRA). In one embodiment, a refresh operation refreshes a row of memory cells simultaneously. The rows can be refreshed sequentially (one right after the other) or distributed within the refresh cycle. To perform a refresh to a row, the second or refresh row decoder activates the refresh wordline of the row to be refreshed. The information stored in memory cells of the row are read, sensed by the second or refresh amplifier banks, and written back into the memory cells of the refreshed row.

In accordance with one embodiment of the invention, the comparator unit comprises a test control unit 228 and a testing circuit 230. In one embodiment, the test control unit 228 performs a memory test in response to test control signals from the BIST control unit. In one embodiment, the test control unit is coupled to the control circuit 222 and the refresh control unit 226. Testing of the read/write access is carried out by providing an active write signal to the access control unit 222 to initiate a write operation. In one embodiment, the test control unit is activated using a test-start signal (TStart). The test control unit receives an address (Add) from the BIST control unit and provides the row address portion RA and the column address portion CA to the row decoder and column decoder respectively. A port address can also be provided to the row decoder to select the appropriate port. Test data TData is provided by the BIST control unit on, for example, the data-in (DI) bus, and written to the respective memory locations.

The test control unit then initiates a read operation in response to an active read signal from the BIST control unit. The access control block activates the word line drivers associated with the decoded row address to select the word line coupled thereto. The interface circuit latches the memory data (MemData) from the selected bitlines and transfers it to the testing circuit 230. The testing circuit compares the memory data with the test pattern (TData) in response to a control signal (CControl) from the test control unit. Parallel bit testing, in which a plurality of bits is tested, may be employed to increase the efficiency of testing. For example, N bits are read simultaneously from memory and tested against TData.

The refresh operation is tested after the read/write access test. In one embodiment, the test control unit generates the active RE signal to initiate a refresh. The refresh amplifiers are activated, refreshing the cells of the selected refresh word lines. In one embodiment, the test control unit then generates an active read signal to the access control unit to initiate a read operation. Alternatively, the active read signal is provided by the BIST control unit. The memory data MemData is subsequently compared to the test pattern (TData) supplied by the BIST control unit. In one embodiment, the results of the comparison sBitF are passed to the test control unit and stored in, for example, a buffer. The results from a plurality of test runs are combined using, for example, a logical OR circuit to generate the final results BitF. The final results BitF are output to the BIST control unit with the corresponding addresses Add.

Figure 4:
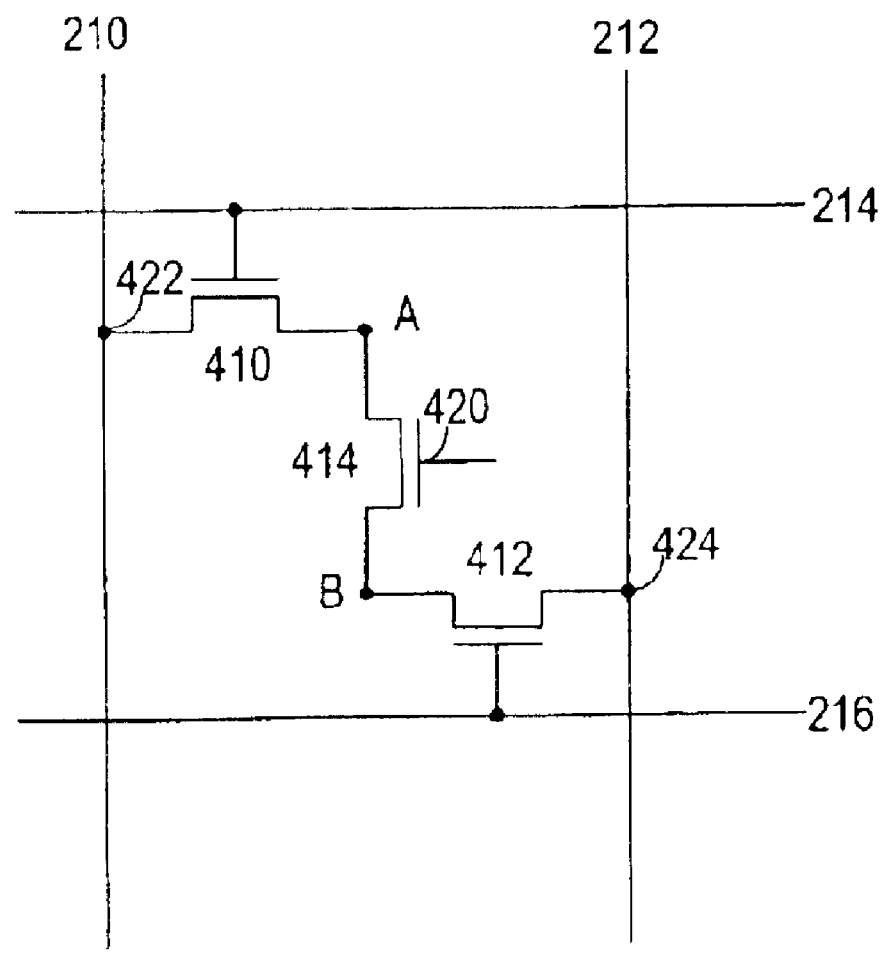
FIG. 4 shows a memory cell in accordance with one embodiment of the invention.

FIG. 4 shows a memory cell 204 in accordance with one embodiment of the invention. The memory cell comprises first and second access transistors 410 and 412 coupled on series to a storage transistor 414. The transistors, in one embodiment, are n-FETs. The use of p-FETs or a combination of n and p-FETs is also useful. The first access transistor serves as the memory access port and is coupled to a bit line 210 and a word line 214; the second access transistor serves as the refresh port and is coupled to a refresh bit line 212 and refresh word line 216. A gate 420 of the storage transistor is coupled to an active signal to render the transistor conductive. In one embodiment, an n-FET storage transistor has its gate coupled to $V_{DD}$. As such, when power is applied to the IC, the storage transistor is rendered conductive, coupling node A to node B. When power is removed from the IC, node A and node B are isolated from each other.

To perform a memory access, the word line is activated or selected (e.g., logic 1) to render the first access transistor conductive. As a result, node A is coupled to the bit line via terminal 422 of the first access transistor. The charge stored at node A is transferred to the bit line for a read access or the charge on the bit line is transferred to node A for a write. A refresh is performed by activating refresh word line to render the second access transistor conductive, coupling node B to the refresh bit line via terminal 424.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit comprising:
   a memory array having a plurality of memory banks;
   a plurality of comparator units, each associated with one memory bank; and
   a BIST control unit coupled to the memory array, the BIST control unit generates control signals and a test pattern for testing the memory array, wherein the comparator units facilitate testing the memory banks simultaneously by having each comparator unit comparing a word read from its associated memory bank with the test pattern written.

2. The integrated circuit of claim 1 wherein the memory banks occupy a common address space and the BIST control unit generates addresses in the common address space.

3. The integrated circuit of claim 1 wherein the memory banks can have different sizes.

4. The integrated circuit of claim 1 wherein the comparator units store faulty addresses.

5. The integrated circuit of claim 1, 2, 3 or 4 wherein the BIST control unit receives test results from the comparator units.

6. The integrated circuit of claim 5 wherein the BIST control unit outputs the test results serially in response to an input clock signal.

7. The integrated circuit of claim 6 wherein the test results comprise addresses of faulty words.

8. The integrated circuit of claim 6 wherein the test results comprise addresses of faulty words and locations of faulty bits within the faulty words.

9. The integrated circuit of claim 5 wherein the test results comprise addresses of faulty words.

10. The integrated circuit of claim 5 wherein the test results comprise addresses of faulty words and locations of faulty bits within the faulty words.

11. The integrated circuit of claim 2 wherein the comparator units store faulty addresses.

12. The integrated circuit of claim 3 wherein the comparator units store faulty addresses.

13. An integrated circuit comprising:
   a memory array having a plurality of memory banks, wherein a memory bank includes a plurality of memory cells having first and second ports;
   a plurality of comparator units, each associated with one memory bank; and
   a BIST control unit coupled to the memory array, the BIST control unit generates control signals and a test pattern for testing the memory array, wherein the comparator units facilitate testing the memory banks simultaneously by having each comparator unit comparing a word read from its associated memory bank with the test pattern written.

14. The integrated circuit of claim 13 wherein a test mode for testing can be either single port or dual port test mode.

15. An integrated circuit comprising:
a memory array having a plurality of memory banks;
a plurality of comparator units, a comparator unit being coupled to a memory bank for comparing a test pattern written to the memory bank against data read from the memory bank, wherein the comparator unit comprises a test control unit and a testing circuit, the test control unit is coupled to an access control circuit and a refresh control unit; and
a BIST control unit coupled to the plurality of comparator units for testing the plurality of memory banks in parallel, the BIST control unit provides test control signals and the test pattern to the comparator units.

16. The integrated circuit of claim 15 wherein the memory banks include a plurality of memory cells having first and second ports and wherein a test mode for testing can be either single port or dual port test mode.

17. The integrated circuit of claim 15 or 16 wherein the test control signals comprise addresses of memory words to be tested.

18. The integrated circuit of claim 17 wherein the memory banks can have different sizes.

19. The integrated circuit of claim 17 wherein the comparator units store faulty addresses.

20. The integrated circuit of claim 18 wherein the BIST control unit receives test results from the comparator units.

21. The integrated circuit of claim 20 wherein the comparator units store faulty addresses.

22. An integrated circuit comprising:
a memory array which includes a plurality of memory banks;
a plurality of comparator units, wherein at least one comparator is associated with one memory bank; and
a BIST control unit coupled to the memory array, the BIST control unit receives input control signals and, in response to the input control signals, causes the integrated circuit to be in test mode and generates test control signals and a test pattern, wherein each comparator unit compares a word read from its associated memory bank with the test pattern written.

23. The integrated circuit of claim 22 wherein memory cells of the memory array comprise dual-port memory cells and the test mode can be either single port or dual port test mode.

24. The integrated circuit of claim 23 wherein some or all the plurality of memory banks can be of different sizes.

25. The integrated circuit of claim 24 wherein memory cells of the memory array comprise dual-port memory cells and the test mode can be either single port or dual port test mode.

26. The integrated circuit of claim 22, 23, 24 or 25 wherein the test control signals comprise memory addresses to be tested.

27. The integrated circuit of claim 26 wherein the test mode generates test patterns selected from march, checkerboard, wordline strip, blanket, or a combination thereof.

28. The integrated circuit of claim 26 wherein defective addresses are stored in the comparator units.

29. The integrated circuit of claim 26 wherein the BIST control unit outputs the test results comprising addresses of faulty words.

30. The integrated circuit of claim 26 wherein the BIST control unit outputs the test results comprising addresses of faulty words and locations of faulty bits within the faulty words.

* * * * *

UNITED STATES PATENT AND TRADEMARK OFFICE
CERTIFICATE OF CORRECTION

PATENT NO. : 6,853,597 B2
DATED : February 8, 2005
INVENTOR(S) : Raj Kumar Jain

It is certified that error appears in the above-identified patent and that said Letters Patent is hereby corrected as shown below:

Column 2,
Line 35, replace "A read test is performed thereafter by ativating the comparator units" with -- A read access test is performed thereafter by activating the comparator units. --.

Column 3,
Line 37, replace "Perferably a word size is equal to 2 bit, where n is a whole number" with -- Perferably a word size is equal to 2n bit, where n is a whole number. --.

Signed and Sealed this

Thirtieth Day of August, 2005

JON W. DUDAS
*Director of the United States Patent and Trademark Office*